United States Patent
Maejima

[19]

[11] Patent Number: 5,973,536
[45] Date of Patent: *Oct. 26, 1999

[54] SWITCHED CAPACITOR FILTER

[75] Inventor: Toshio Maejima, Hamamatsu, Japan

[73] Assignee: Yamaha Corporation, Hamamatsu, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/706,536

[22] Filed: Sep. 5, 1996

[30] Foreign Application Priority Data

Sep. 7, 1995 [JP] Japan ..................................... 7-230557

[51] Int. Cl.⁶ .............................. G06G 7/186; H03K 5/00
[52] U.S. Cl. .......................... 327/337; 327/554; 327/552; 327/336; 330/9
[58] Field of Search ................................ 327/91, 94, 552, 327/554, 337, 336, 344, 175; 333/173; 330/9, 51, 294, 107, 1

[56] References Cited

U.S. PATENT DOCUMENTS 4,446,438  5/1984  Chang et al. ............................ 327/554

FOREIGN PATENT DOCUMENTS 406209244  7/1994  Japan ..................................... 327/175

OTHER PUBLICATIONS

Patrick W. Bosshart ("A Multiplexed Switched Capacitor Filter Bank", IEEE Journal of Solid State Circuits, vol. SC–15, No. 6, 1980, pp. 939–945.

*Primary Examiner*—Dinh Le
*Attorney, Agent, or Firm*—Pillsbury Madison & Sutro LLP

[57] ABSTRACT

A switched capacitor filter for applying a filter processing including an integration processing to input analog signals of plural channels on a time shared basis includes an integration sections for sequentially implementing the integration processing for the respective channels on a time shared basis, integrated value storage sections for storing integrated value signals representing results of the integration processing for the respective channels, switches for causing, each time the integration processing for the respective channels is interrupted, an integrated value signal representing result of the integration processing for the particular channel at the time of interruption to be stored in the integrated value storage sections and initializing the result of the integration processing by the integration section and, each time the integration processing for the respective channels is implemented, supplying the integrated value signal for the particular channel from the integrated value storage sections to the integration section and supplying also an analog signal to be processed in the integration processing to the integration section.

6 Claims, 14 Drawing Sheets

2

SWITCHED CAPACITOR FILTER

BACKGROUND OF THE INVENTION

This invention relates to a switched capacitor filter.

An example of a prior art switched capacitor filter is shown in FIG. 14. This filter is a one-stage low-pass filter including switched capacitor circuits 1 and 2 and an integrator 3. The switched capacitor circuits 1 and 2 perform a function of a resistance element and the switched capacitor circuit 1 is constructed of a capacitor 10 and four analog switches 11 to 14. The other switched capacitor circuit 2 is of a similar construction.

In this filter, the analog switches 11 and 13 are brought into conduction by a clock Φa which is generated at a predetermined interval. By conduction of these analog switches 11 and 13, a signal path from the analog switch 11 to the ground through a capacitor 10 and the analog switch 13 is formed. By supplying an input signal through this signal path, an electric charge corresponding to the level of the input signal is held in the capacitor 10. The analog switches 12 and 14 are brought into conduction by a clock b which is generated alternately with the clock Φa at a predetermined interval. By conduction of these analog switches 12 and 14, a signal path from the ground to the integrator 3 through the capacitor 10 and the analog switch 14 is formed. By supplying an input signal through this signal path, an electric charge held in the capacitor 10 is supplied to the integrator 3.

Since the clocks Φa and Φb are alternately generated at a predetermined interval respectively, the operation for holding an electric charge corresponding to the level of an input signal in the capacitor 10 and the operation for supplying this electric charge to the integrator 3 are alternately performed at the predetermined interval and electric current corresponding to the level of the input signal is supplied to the integrator 3. The same operations are performed in the other switched capacitor circuit 2. As a result of performing of the function of a resistance element by these switched capacitor circuits 1 and 2, the circuit shown in FIG. 14 performs a function which is equivalent to an analog filter in which the switched capacitor circuits 1 and 2 are replaced by resistance elements.

In the audio-visual devices which processes analog signals, there are many cases where the filter processing is applied to analog signals of plural channels such as an L-channel and a R channel. In conventional audio-visual devices, filters of a number corresponding to the number of channels are used to cope with such case resulting in a high manufacturing cost of the audio-visual device.

SUMMARY OF THE INVENTION

An object of the present invention to provide a switched capacitor filter capable of performing a filter processing for analog signals of plural channels with a simple and compact circuit design.

Briefly, an embodiment of the present invention is directed to a switched capacitor circuit for integrating input analog signals of plural channels on a time multiplexed basis. An integration circuit sequentially integrates input signals of respective ones of the plural channels on a time multiplexed basis to provide an integration result for each of the respective channels. A plurality of integrated value storage circuits store integrated value signals representing the integration result for each of the plural channels. For any particular channel, a switch causes the storage of the integration result for the particular channel as an integrated value signal in an associated integrated value storage circuit. Each time the integration process for the particular channel is commenced, the switch supplies to the integration circuit the integrated value for the particular channel from the integrated storage value circuit, in addition to an analog signal corresponding to the particular channel.

By employing an integration circuit for integrating input signals of the respective ones of the plural channels on a time multiplexed basis, filter processing can be performed with a simple and compact circuit design.

BRIEF DESCRIPTION OF THE DRAWINGS

In the accompanying drawing.

Figure 1:
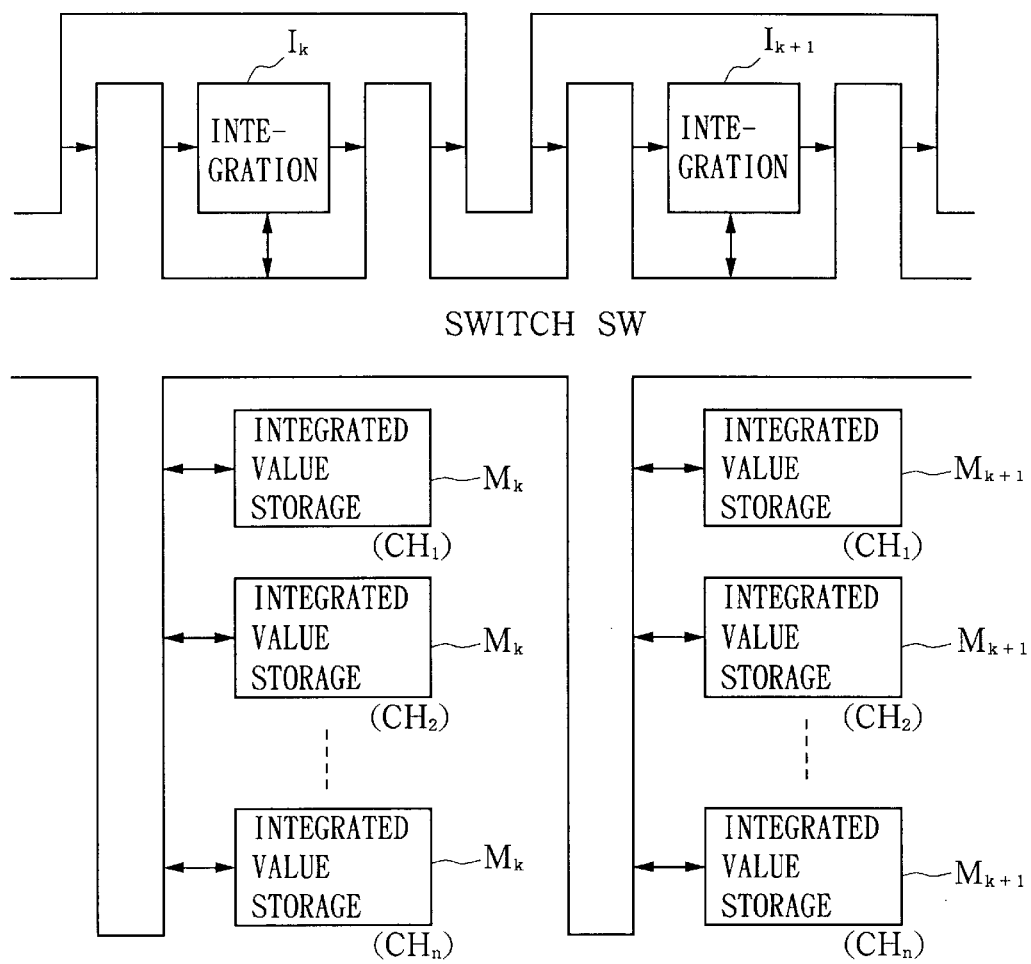
FIG. 1 is a block diagram schematically showing the basic concept of the invention.

For achieving the above described object of the invention, there is provided a switched capacitor filter for applying a filter processing including an integration processing to input analog signals of plural channels on a time shared basis. The switched capacitor filter according to the invention comprises, as shown in FIG. 1, integration means $I_k$, $I_{k+1}$, . . . , switch means SW and integrated value storage means $M_k$, $M_k$, . . . , $M_{k+1}$, $M_{k+1}$, . . . .

The integration means sequentially implements the integration processing for the respective channels on a time shared basis. In a case where there are plural integration processings, provision of the integration means $I_k$, $I_{k+1}$, . . . corresponding to the respective integration processings enables a simplified circuit design. Such circuit design will also be preferable in a case where a high speed operation is desired.

The integrated value storage means stores integrated value signals representing results of the integration processing for the respective channels. Provision of the integrated value storage means $M_k$ etc. for the respective channels as shown in FIG. 1 enables a simplified circuit design but it is not absolutely necessary to provide the same number of the integrated value storage means as the number of channels.

The switch means causes, each time the integration processing for the respective channels is interrupted, an integrated value signal representing result of the integration processing for the particular channel at the time of interruption to be stored in the integrated value storage means and initializes the result of the integration processing by the integration means and, each time the integration processing for the respective channels is implemented, supplies the integrated value signal for the particular channel from the integrated value storage means to the integration means and supplies also an analog signal to be processed in the integration processing to the integration means.

In a case where integration processings for plural channels are sequentially implemented by the same integration means, an integration processing for one channel is interrupted by an integration processing for another channel. According to the invention, however, initialization of the result of the integration processing by the integration means is made after the integrated value signal at the time of interruption of the integration processing is stored in the integrated value storage means through the switch means and this stored integrated value signal is supplied to the integration means when the integration processing is resumed. Therefore, the interrupted integration processing is resumed from the state immediately before the interruption. By this control, integration processings constituting the filter processing are implemented by means of a common integration means.

Figure 2:
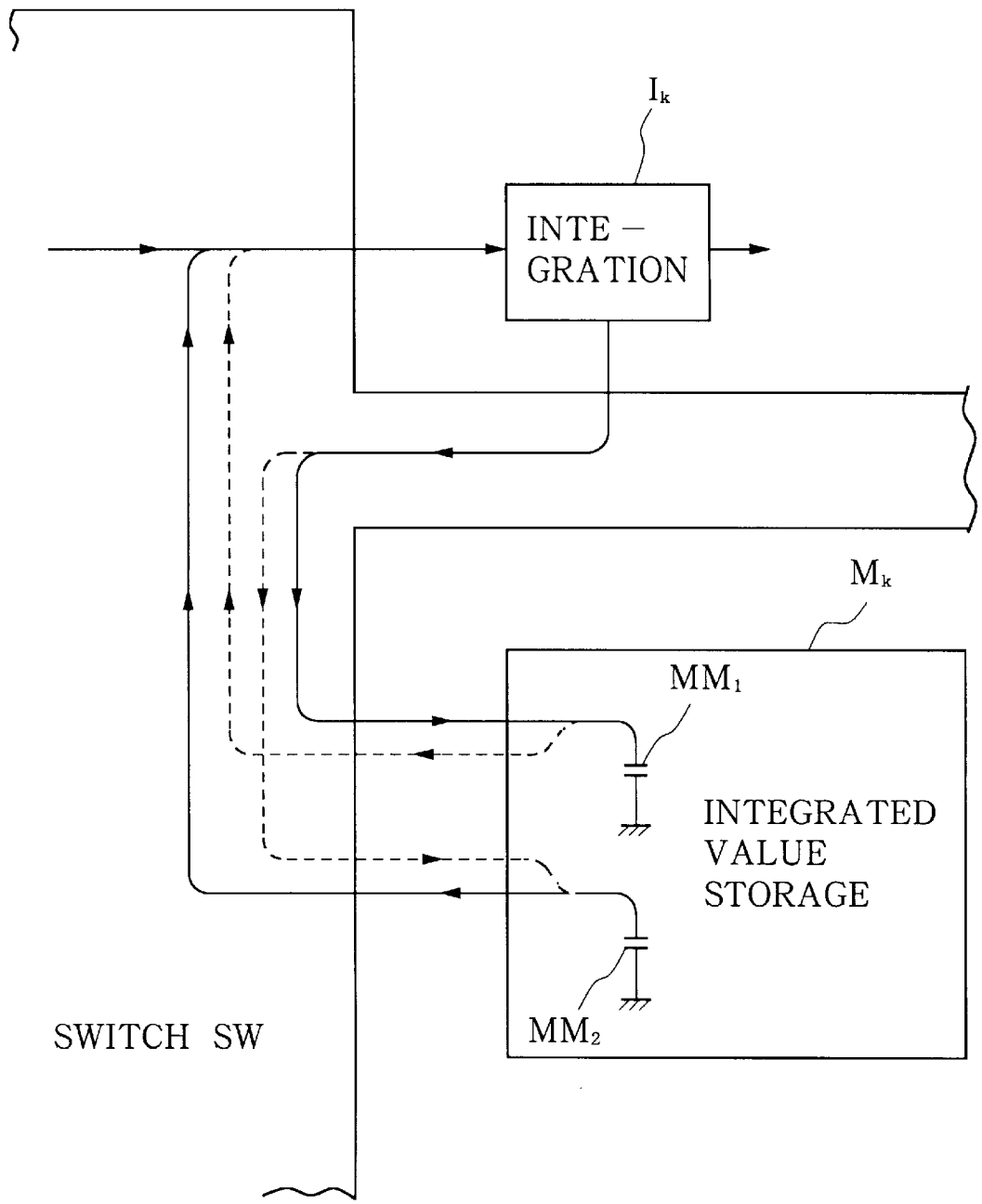
FIG. 2 is a block diagram schematically showing the basic concept of one aspect of the invention.

In one aspect of the invention, in the switched capacitor filter described above, as shown in FIG. 2, the integrated value storage means $M_k$ has at least two storage sections (capacitors in FIG. 2) and the switch means simultaneously implements, each time the integration processing for the respective channels is implemented, an operation for causing an integrated value signal for the particular channel to be stored in one ($MM_1$) of the storage sections of the integrated value storage means $M_k$ and an operation for supplying to the integration means $I_k$ an integrated value signal for the particular channel stored in the other storage section $MM_2$ of the integrated value storage means. These operations are indicated by arrows with full lines in FIG. 2. Upon completion of these operations, "the integrated value signal for the particular channel" has been stored in the storage section $MM_1$. Therefore, when an integration processing is performed for this channel next time, "the integrated value signal for the particular channel" is read from the storage section $MM_1$ and supplied to the integration means and the integrated value signal representing the result of the integration processing is stored in the storage section $MM_2$. These operations are indicated by arrows with dotted lines in FIG. 2.

According to this aspect of the invention, writing and reading of an integrated value are performed simultaneously so that a high speed operation can be realized.

Figure 3:
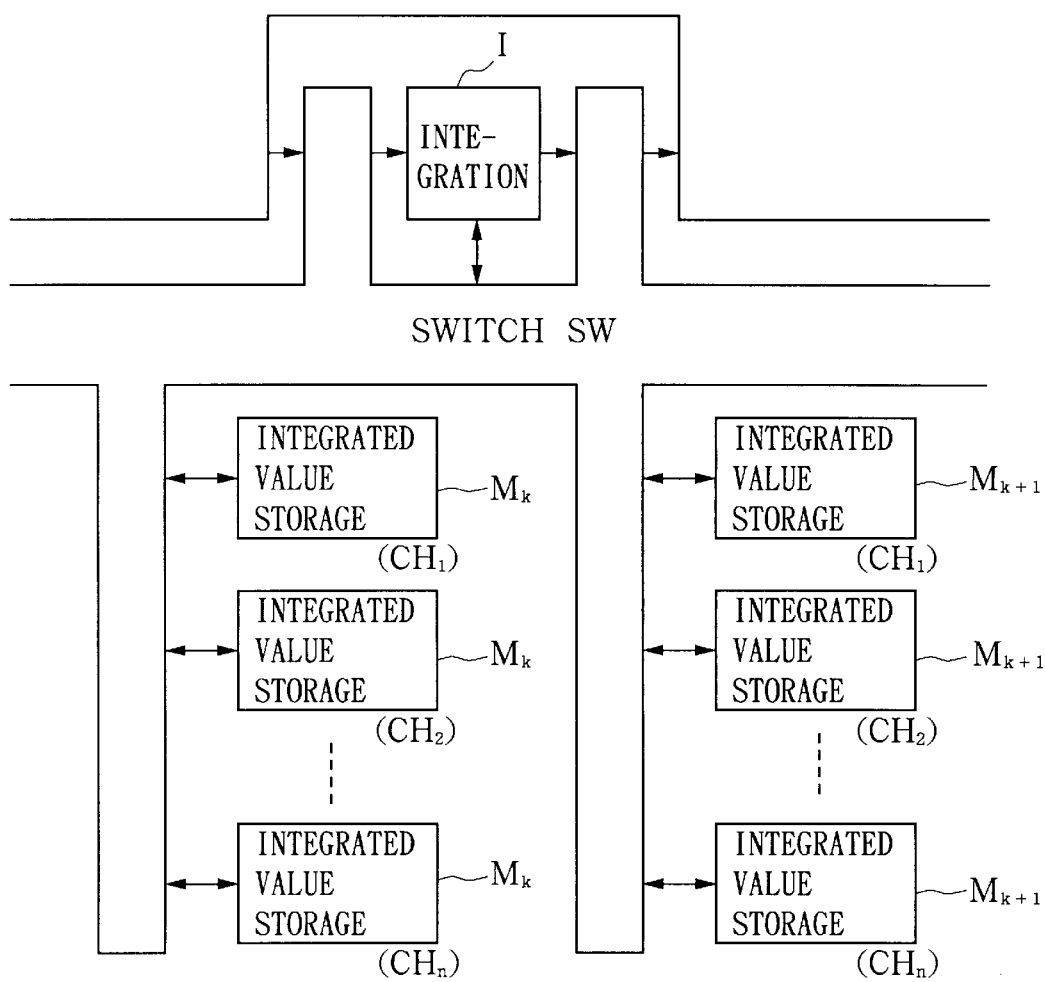
FIG. 3 is a block diagram schematically showing the basic concept of another aspect of the invention.

In another aspect of the invention, in the switched capacitor filter, the filter processing includes plural types of integration processings and the integration means I sequentially implements the respective integration processings on a time shared basis as shown in FIG. 3.

This aspect of the invention has the advantage that the number of integration means can be reduced in a case where demand for a high speed operation is not strict.

Preferred embodiments of the invention will be described below with reference to the accompanying drawings. These embodiments are only illustrative and not restrictive and can be modified suitably within the spirit and scope of the invention.

DESCRIPTION OF PREFERRED EMBODIMENTS

Figure 4:
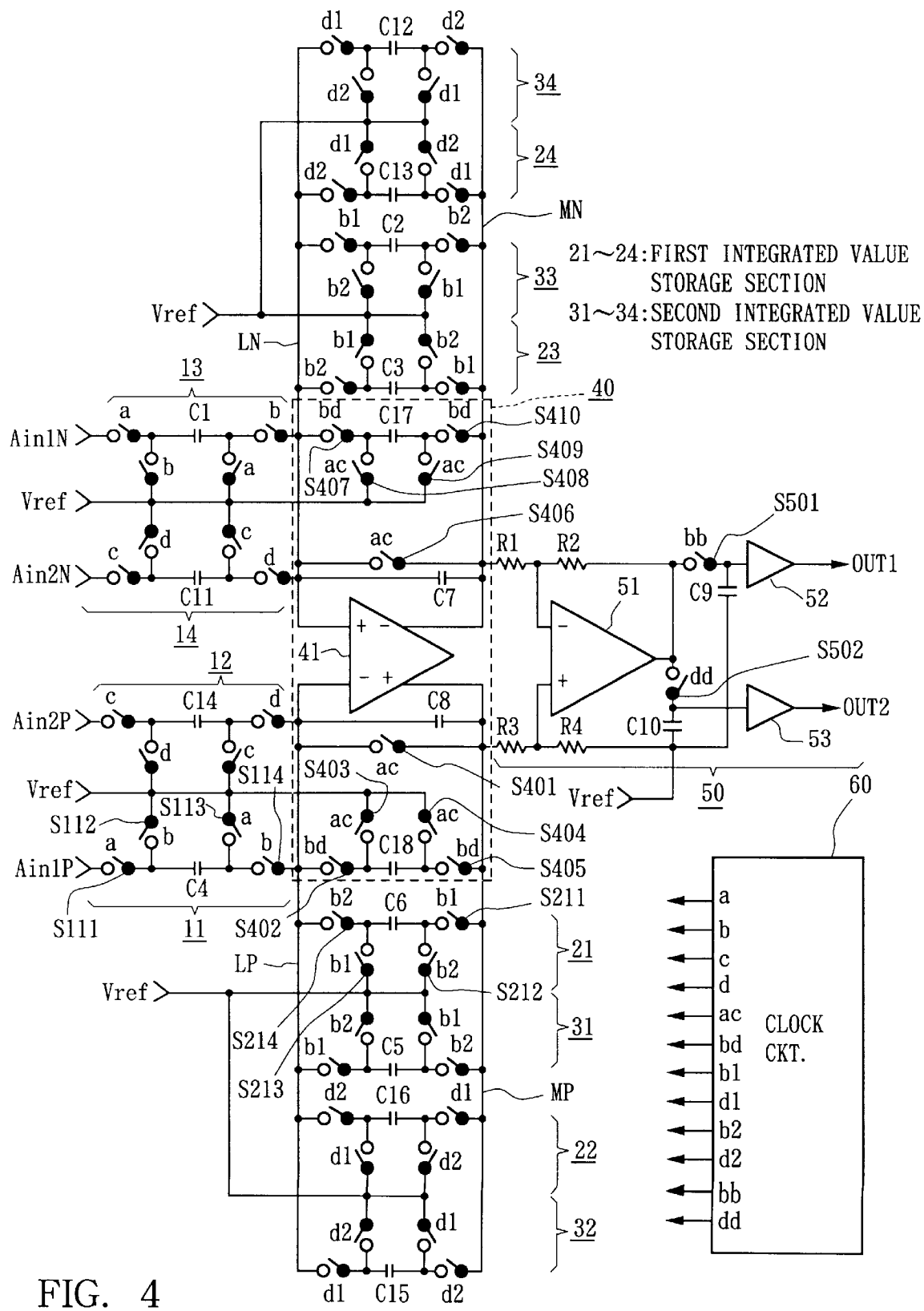
FIG. 4 is a block diagram showing an analog-to-digital converter of an embodiment of the invention.
Figure 14:
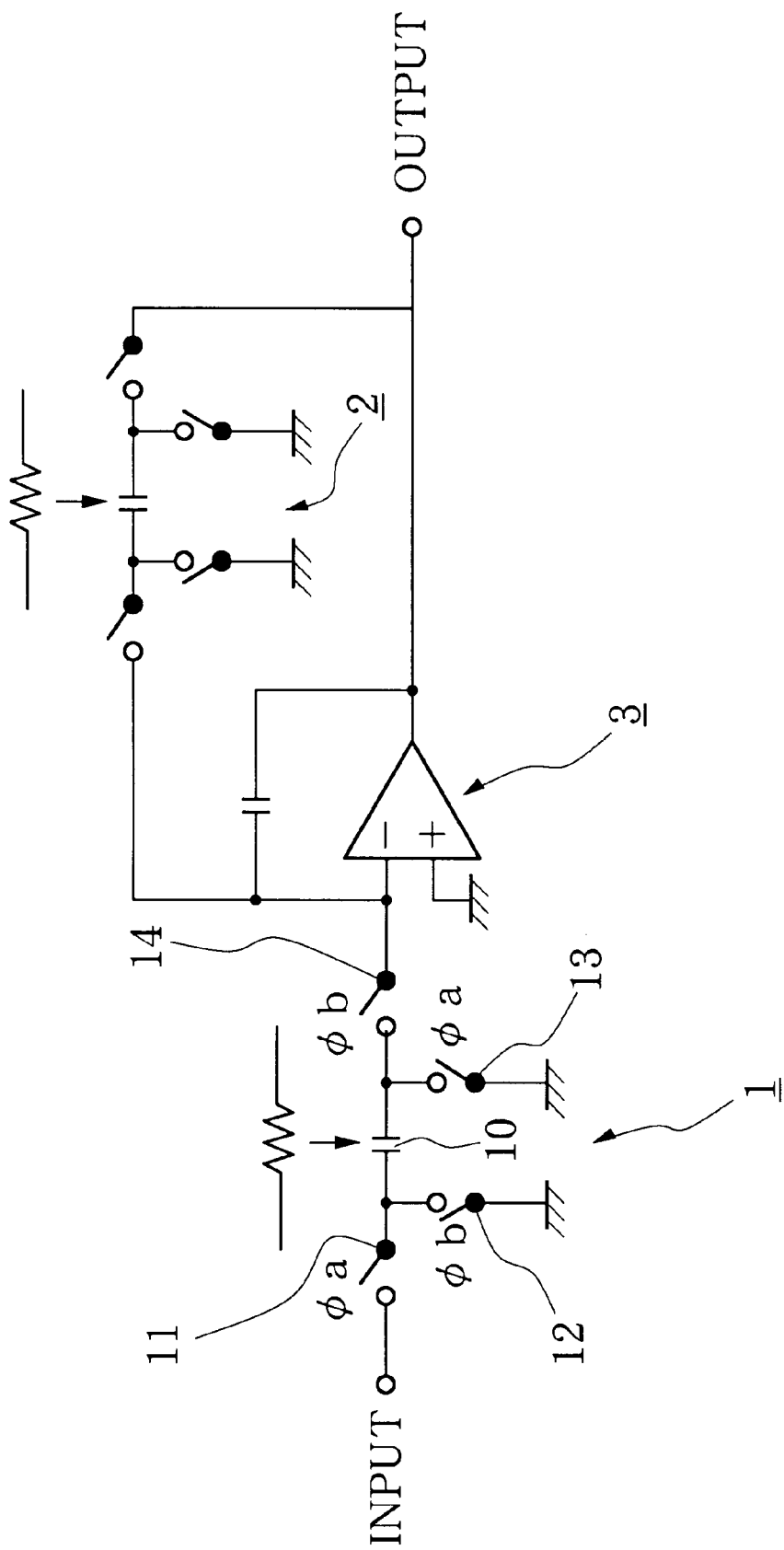
FIG. 14 is a block diagram showing a prior art switched capacitor filter.

FIG. 4 shows an embodiment of the invention. This embodiment has improved the switched capacitor filter as shown in FIG. 14 so that two channel analog signals Ain1 and Ain2 can be processed. FIG. 4 shows a part corresponding to an integrator of the improved switched capacitor filter. Each analog signal to be processed is a balanced signal. The analog signal Ain1 of the first channel consists of a positive-phase signal AinP1 and a negative-phase signal AinN1 and the analog signal Ain2 of the second channel consists of a positive-phase signal AinP2 and a negative-phase signal AinN2.

A clock circuit 60 is a circuit for controlling operation timing of component parts of this filter and produces clocks a, b, c, d, ac, bd, b1, d1, b2, d2 and dd necessary for the timing control. Waveforms of these clocks are shown in the time chart of FIG. 5.

Input switched capacitor sections 11 to 14 produce current corresponding to the level of each input analog signal. Among the input analog signal described above, the positive-phase signal Ain1P of the first channel is supplied to the input switched capacitor section 11, the positive-phase signal Ain2P of the second channel to the input switched capacitor section 12, the negative-phase signal Ain1N of the first channel to the input switched capacitor section 13 and the negative-phase signal Ain2N of the second channel to the input switched capacitor section 14 respectively. Currents provided from the input switched capacitor sections 11 and 12 are supplied to a signal line LP (hereinafter referred to as "positive-phase input line LP") and currents provided from the input switched capacitor sections 13 and 14 are supplied to a signal line LN (hereinafter referred to as "negative-phase input line LN").

Construction of each of these input switched capacitor sections will now be described. The input switched capacitor section 11 is composed of a capacitor C4 and four analog switches S111 to S114. The analog switches S111 and S113 are brought into conduction by the clock a. By conduction of these analog switches, a signal path from the analog switch S111 to a reference power source Vref through the capacitor C4 and the analog switch S113 is formed. By supplying the input analog signal Ain1P through this signal path, an electric charge corresponding to the level of this input signal is held by the capacitor C4 (sampling operation). The analog switches S112 and S114 are brought into conduction by the clock b. By conduction of these analog switches, a signal path from the reference power source Vref to the positive-phase input line LP through the analog switch S112, the capacitor C4 and the analog switch S114 is formed. By supplying a signal through this signal path, the electric charge held by the capacitor C4 is inverted in polarity and supplied to the positive-phase input line LP (output operation).

The other input switched capacitor sections 12 to 14 are of the same construction as the input switched capacitor section 11, i.e., they are respectively composed of a single capacitor for holding an input analog signal to each section and four analog switches for forming a signal path for applying an input analog signal to the capacitor and a signal path for outputting the electric charge held by the capacitor. The reference characters of these capacitors and clocks for conducting these analog switches are shown in the figure.

In the present embodiment, each of the input switched capacitor sections 11 to 14 is controlled at a timing which differs for each channel. The input switched capacitor sections 11 and 13 for the first channel perform the sampling operation in response to the clock a and the input switched capacitor sections 12 and 14 for the second channel perform the sampling operation in response to the clock b. As to the sampling operation, it may be made at the same timing for both the first and second channels. The input switched capacitor sections 11 and 13 for the first channel perform the output operation in response to the clock b and the input switched capacitor sections 12 and 14 for the second channel perform the output operation in response to the clock d.

An integrator 40 is composed of a differential amplifier 41, capacitors C7, C8, C17 and C18 and analog switches S401 to S410. The negative input terminal of the differential amplifier 41 is connected to the positive-phase input line LP and the positive input terminal of the differential amplifier 41 is connected to the negative-phase input line LN. The positive output terminal and the negative output terminal of the differential amplifier 41 are connected respectively to signal lines MP and MN (hereinafter referred to as "positive-phase output line MP" and "negative-phase output line MN").

An integrating capacitor C8 is inserted between the negative input terminal and the positive output terminal of the differential amplifier 41 and an integrating capacitor C7 is inserted between the positive input terminal and the negative output terminal of the differential amplifier 41. In the present embodiment, the integration operation is performed during a period of the clock bd. During this integration operation, the capacitor 18 is connected in parallel to the integrating capacitor C8 through the analog switches S402 and S405 and the capacitor 17 is connected in parallel to the integrating capacitor C7 through the analog switches S407 and S410.

By this construction, integration of signals applied to the positive and negative input terminals of the differential amplifier 41 is performed in the state where the potentials at these input terminals are maintained at the level of the reference power source Vref and all electric charges supplied through the positive-phase input line LP are accumulated in the integrating capacitor C8 and all electric charges supplied through the negative-phase input line LN are accumulated in the integrating capacitor C7. As a result, voltage corresponding to the integrated values is provided across the positive output terminal and the negative output terminal of the differential amplifier 41. This output voltage corresponding to the integrated values is separated into a positive-phase voltage and a negative-phase voltage through the positive-phase output line MP and the negative-phase output line MN and supplied to the respective portions of the filter.

The analog switches S401, S403, S404, S406, S408 and S409 are brought into conduction by the clock ac and used as initializing analog switches for short-circuiting the capacitors C7, C8, C17 and C18 and reset the integrated value to 0.

This integration section 40 implements integration processings for the first and second channels sequentially and repeatedly on a time shared basis. For realizing such time shared control of integration processing, the following arrangement is made in the present embodiment:

a. In a case where an integration processing under implementation is interrupted, the integrated value of the integration section 40 is initialized to 0 and the integration section 40 is used for a next integration processing. The initializing analog switch S performs this function.

b. When the integration processing is interrupted, the integrated value obtained by the time point of interruption is stored in a storage means. When the interrupted integration processing is resumed, the stored integrated value is supplied to the integration section 40 and the integration processing is resumed from the state at the time point of interruption. The circuit portion for enabling this is first integrated value storage sections 21 to 24 and second integrated value storage sections 31 to 34.

These integrated value storage sections store signals representing integrated values each time the integration section 40 performs the respective integration processings. In the present embodiment, filter processings for the first and second channels are performed by performing integration processings for the first and second channels. A positive-phase signal representing an integrated value of the integration processing for the first channel is stored in the first integrated value storage section 21 and the second integrated value storage section 31. A negative-phase signal representing an integrated value of the integration processing for the first channel is stored in the first integrated value storage section 23 and the second integrated value storage section 33. A positive-phase signal representing an integrated value of the integration processing for the second channel is stored in the first integrated value storage section 22 and the second integrated value storage section 32. A negative-phase signal representing an integrated value of the integration processing for the second channel is stored in the first integrated value storage section 24 and the second integrated value storage section 34.

Construction of each of these integrated value storage sections will now be described.

The first integrated value storage section 21 is composed, like the input switched capacitor sections, of a capacitor C6 and four analog switches S211 to S214. The analog-switches S211 and S213 are brought into conduction by the clock b1. By conduction of these analog switches, a signal path from the positive-phase output line MP to the reference power source Vref through the analog switch S211, the capacitor C6 and the analog switch S213 is formed. By supplying a signal through this signal path, an electric charge corresponding to a positive-phase component of the signal representing an integrated value is held by the capacitor C6.

The analog switches S212 and S214 are brought into conduction by the clock b2. By conduction of these analog switches, a signal path from the reference power source Vref to the positive-phase input line LP through the analog switch S212, the capacitor C6 and the analog switch S214 is formed. By supplying a signal through this signal path, the electric charge held in the capacitor C6 is supplied in an inverted state of polarity to the positive-phase input line LP. Thus, by outputting of the clock b1, sampling of the integrated value is performed whereas by outputting of the clock b2, an electric charge equivalent to the integrated value is supplied to the positive-phase input line LP in an inverted state of polarity.

The second integrated value storage section 31 is of a similar construction to the first integrated value storage section 21, i.e., it has a single capacitor C5 and four analog switches. In the second integrated value storage section 31, however, the functions performed by the clocks b1 and b2 are reverse to those in the first integrated value storage section 21. By outputting of the clock b1, voltage on the positive-phase output line MP is applied to the capacitor C6 of the first integrated value storage section 21 and the electric charge held in the capacitor C5 of the second integrated value storage section 31 is supplied to the positive-phase input line LP. By outputting of the clock b2, voltage on the positive-phase output line MP is applied to the capacitor C5 of the second integrated value storage section 31 and the electric charge held in the capacitor C6 of the first integrated value storage section 21 is supplied to the positive-phase input line LP.

The other integrated value storage sections are of a similar construction to the first integrated value storage section and the second integrated value storage section, having a single capacitor and four analog switches. Reference characters of these capacitors and analog switches are shown in the figure.

An output section 50 is a section which converts an output signal of each channel derived sequentially from the integration section 40 to a non-balanced signal and outputs separated non-balanced signals. Resistances R1 to R4 and a differential amplifier 51 constitute means for amplifying an output signal of the integration section 40 with an amplification factor determined by the resistances R1 to R4. An analog switch S501 and a capacitor C9 constitute a sample hold circuit for receiving and holding a signal corresponding to the first channel among output signals of the differential amplifier 51. An analog switch S502 and a capacitor C10 constitute a sample hold circuit for receiving and holding a signal corresponding to the second channel among the output signal of the differential amplifier 51. A sampling operation of the sample hold circuit for the first channel is performed by the clock bb and A sampling operation of the sample hold circuit for the second channel is performed by the clock dd. An output signal of the sample hold circuit for the first channel is provided as a signal OUT1 through a buffer 52 and an output signal of the sample hold circuit for the second channel as a signal OUT2 through a buffer 53.

Figure 5:
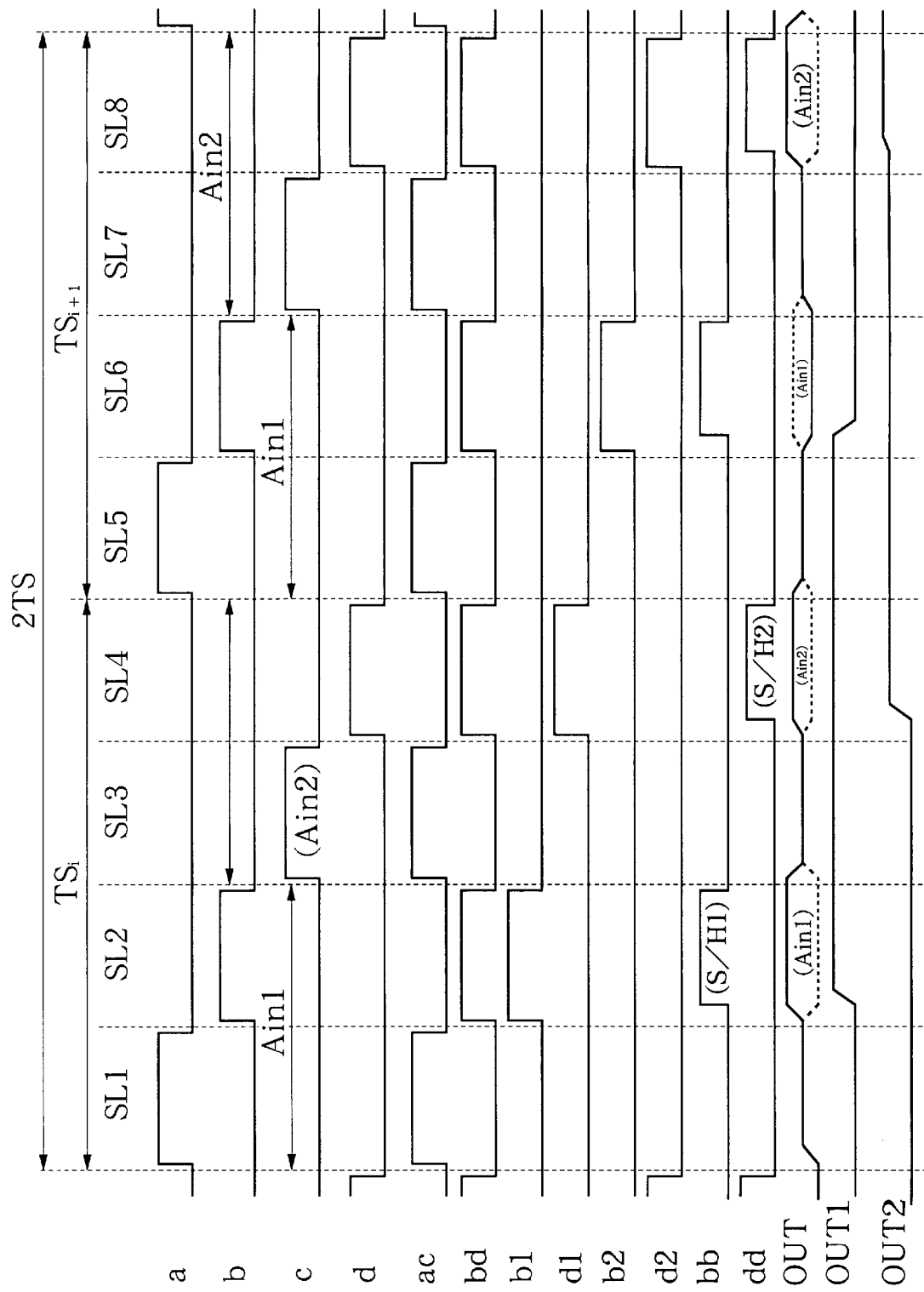
FIG. 5 is a time chart showing the operation of the embodiment.

The operation of the above described embodiment will now be described with reference to the time chart of FIG. 5.

In the present embodiment, an input analog signal is sampled for each sampling period TS and a filter processing for two channels is thereby performed. A series of processings for the filter processing are successively performed on a time slot basis, each time slot being one fourth of one sampling period TS. As regards contents of a processing performed in each time slot, the same processing is repeated on the basis of 8 consecutive time slots, i.e., two sampling periods 2TS being used as a unit. In the following description, a period of two consecutive sampling periods $TS_i$ and $TS_{i+1}$ is divided into time slots SL1 to SL8 and an operation in each time slot will be described.

1. Time Slot SL1

Figure 6:
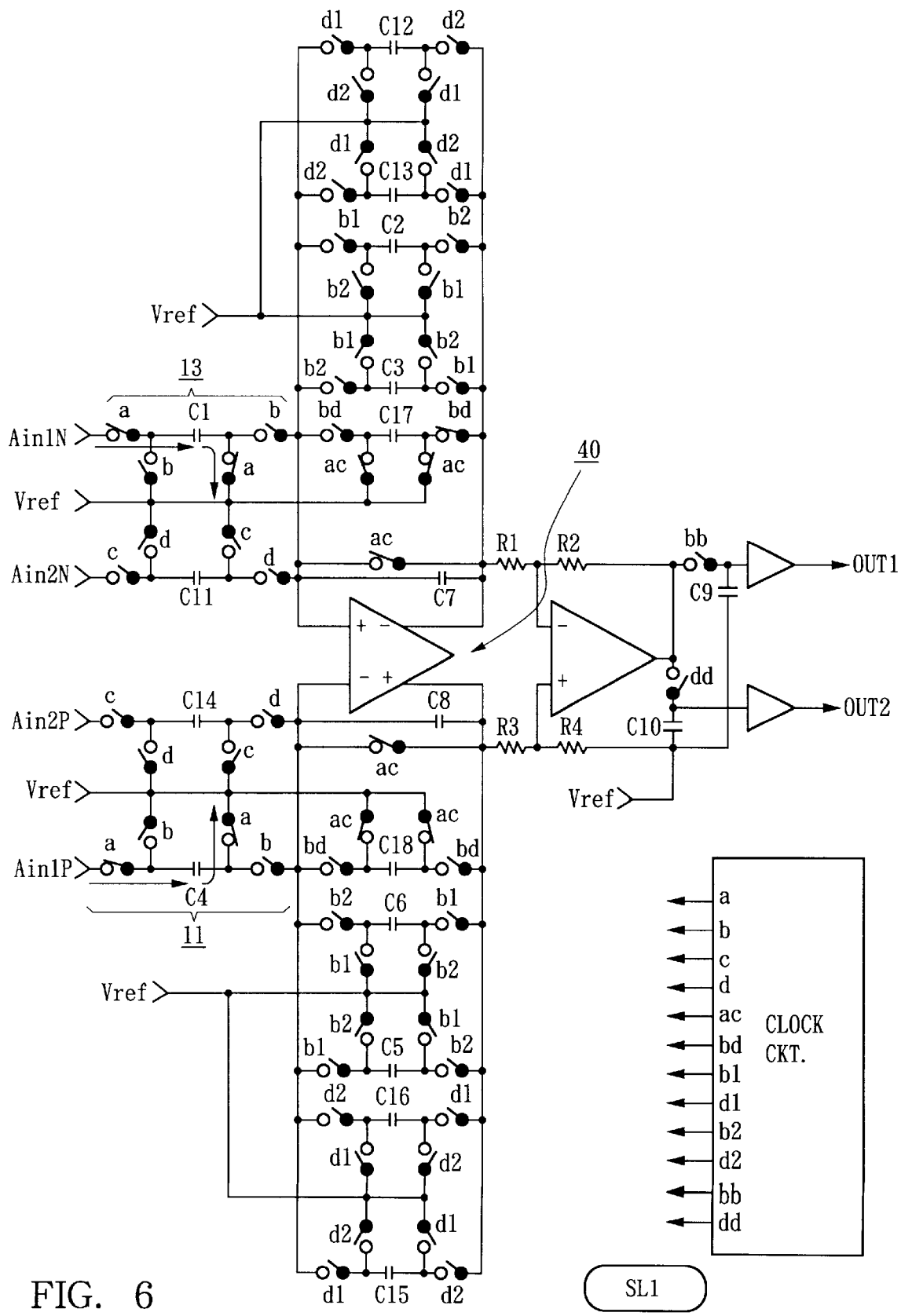
FIG. 6 is a circuit diagram showing an operation of the embodiment.

In the time slot SL1 of the sampling period $TS_i$, the clocks a and ac only are produced and the other clocks are not produced. By outputting of these clocks, the state of the respective analog switches becomes one shown in FIG. 6 and the following operation is performed in the component parts of FIG. 6.

(1) In the input switched capacitor sections 11 and 13, sampling of the input analog signals Ain1P and Ain1N for the first channel is performed and electric charges corresponding to the levels of the respective analog signals are held in the capacitors C4 and C1.

(2) In the integration section 40, the two terminals of the respective capacitors C7, C17, C8 and C18 are short-circuited by the initializing analog switches and the integrated value of the integration section 40 is reset to 0.

2. Time Slot SL2

Figure 7:
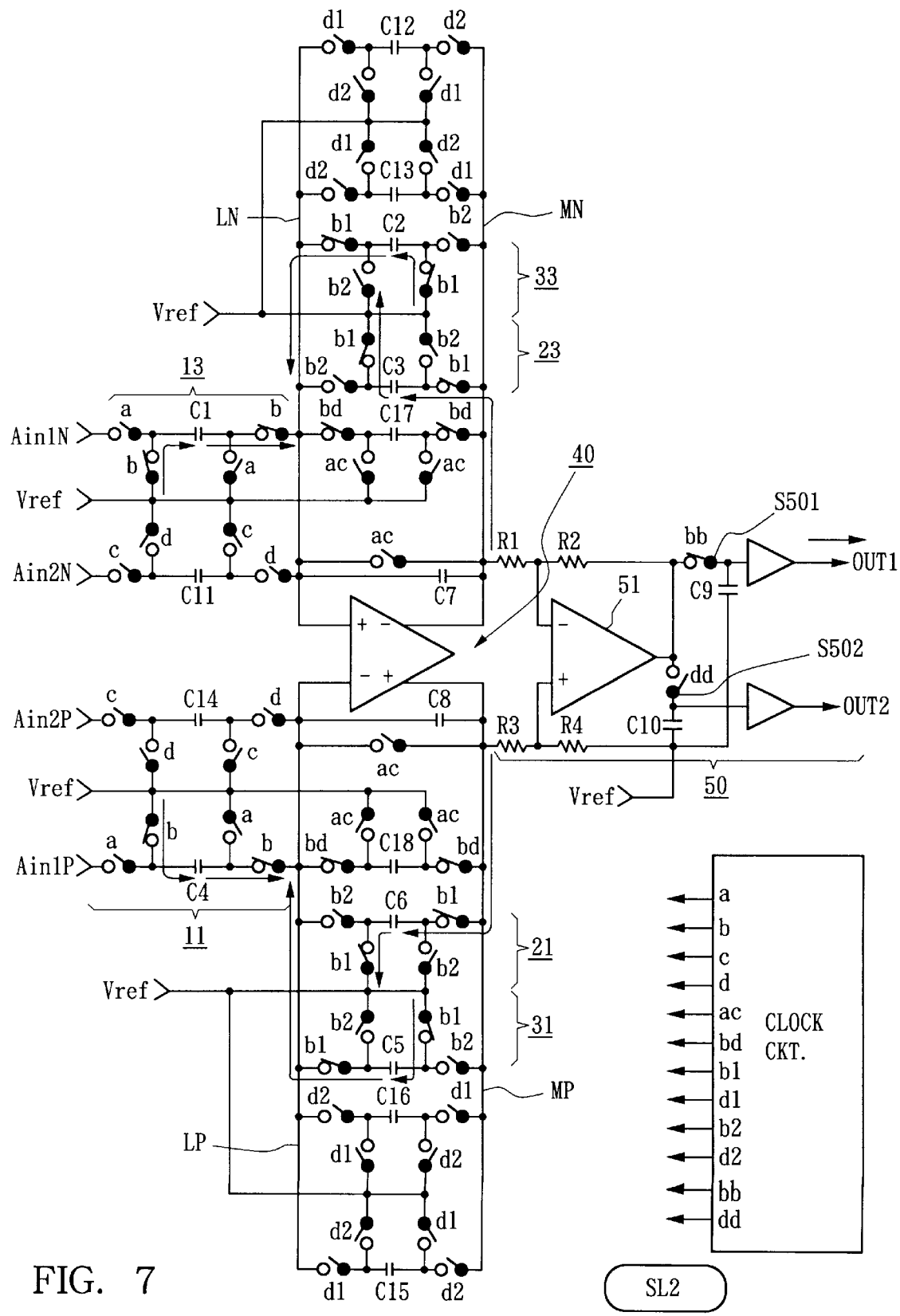
FIG. 7 is a circuit diagram showing an operation of the embodiment.

In this time slot SL2, the clocks b, bd, b1 and bb only are produced and the other clocks are not produced. By outputting of these clocks, the state of the analog switches becomes one shown in FIG. 7 and the following operation is performed.

(1) In the input switched capacitor sections 11 and 13, the electric charges held in the capacitors C4 and C1 are inverted in polarity and supplied on the positive-phase input line LP and the negative-phase input line LN.

(2) In the second integrated value storage sections 31 and 33, the electric charges held in the capacitors C5 and C2 are supplied to the positive-phase input line LP and the negative-phase input line LN. The electric charges held in these capacitors have been provided by the integration section 40 in the sampling period $TS_{i-1}$ and correspond to the integrated value of the integration processing for the first channel.

(3) In the integration section 40, the initializing analog switches are opened and all of the integrating capacitors C8, C18, C7 and C18 are connected to the differential amplifier 41 and, therefore, integration of the respective signals of the above described processings (1) and (2) supplied through the positive-phase input line LP and the negative-phase input line LN is performed. As a result, a sum of the integrated value of the integration processing for the first channel in the sampling period $TS_{i-1}$ and an input analog signal of the first channel loaded in the time slot SL1 is provided as the integrated value for the first channel in the sampling period $TS_{i-1}$ and a voltage corresponding to this integrated value is provided from the differential amplifier 41 to the positive-phase output line MP and the negative-phase output line MN.

(4) In the first integrated value storage sections 21 and 23, an operation for holding the voltage corresponding to the integrated value of the integration processing for the first channel obtained in this way is performed. More specifically, since the signal path from the positive-phase output line MP to the reference power source Vref through the capacitor C6 is formed, an electric charge corresponding to the positive-phase component of the integrated value is held in the capacitor C6 through this signal path. Also, since the signal path from the negative-phase output line MN to the reference power source Vref through the capacitor C3 is formed, an electric charge corresponding to the negative-phase component of the integrated value is held in the capacitor C3 through this signal path.

(5) In the output section 50, the balanced signal representing the integrated value of the first channel supplied between the positive-phase output line MP and the negative-phase output line MN is converted to a non-balanced signal. This non-balanced signal is supplied to the capacitor C9 by generation of the clock bb and also is provided as the signal OUT1. This non-balanced signal is also held om the capacitor C9 by falling of the clock bb.

3. Time Slot SL3

Figure 8:
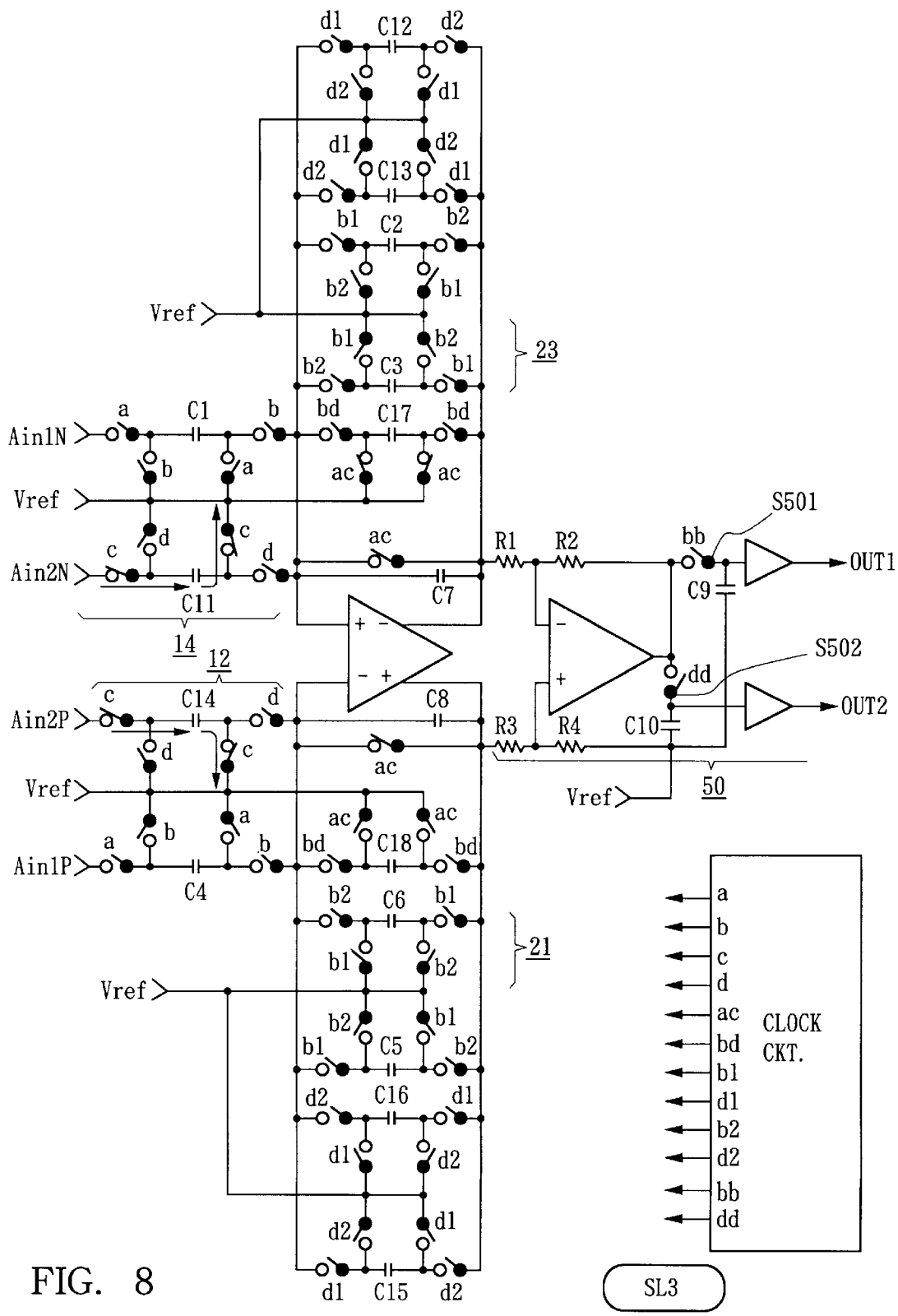
FIG. 8 is a circuit diagram showing an operation of the embodiment.

In this time slot SL3, the clocks c and ac only are produced and the other clocks are not produced. By outputting of these clocks, the state of the analog switches becomes one shown in FIG. 8 and the following operation is performed.

(1) In the input switched capacitor sections 12 and 14, sampling of the input analog signals Ain2P and Ain2N for the second channel is performed and the electric charges corresponding to the levels of these analog signals are held in the capacitors C14 and C11. (2) In the integration section 40, the two terminals of the respective capacitors C7, C17, C8 and C18 are short-circuited by the initializing analog switches and the integrated value of the integration section 40 is reset to 0.

4. Time Slot SL4

Figure 9:
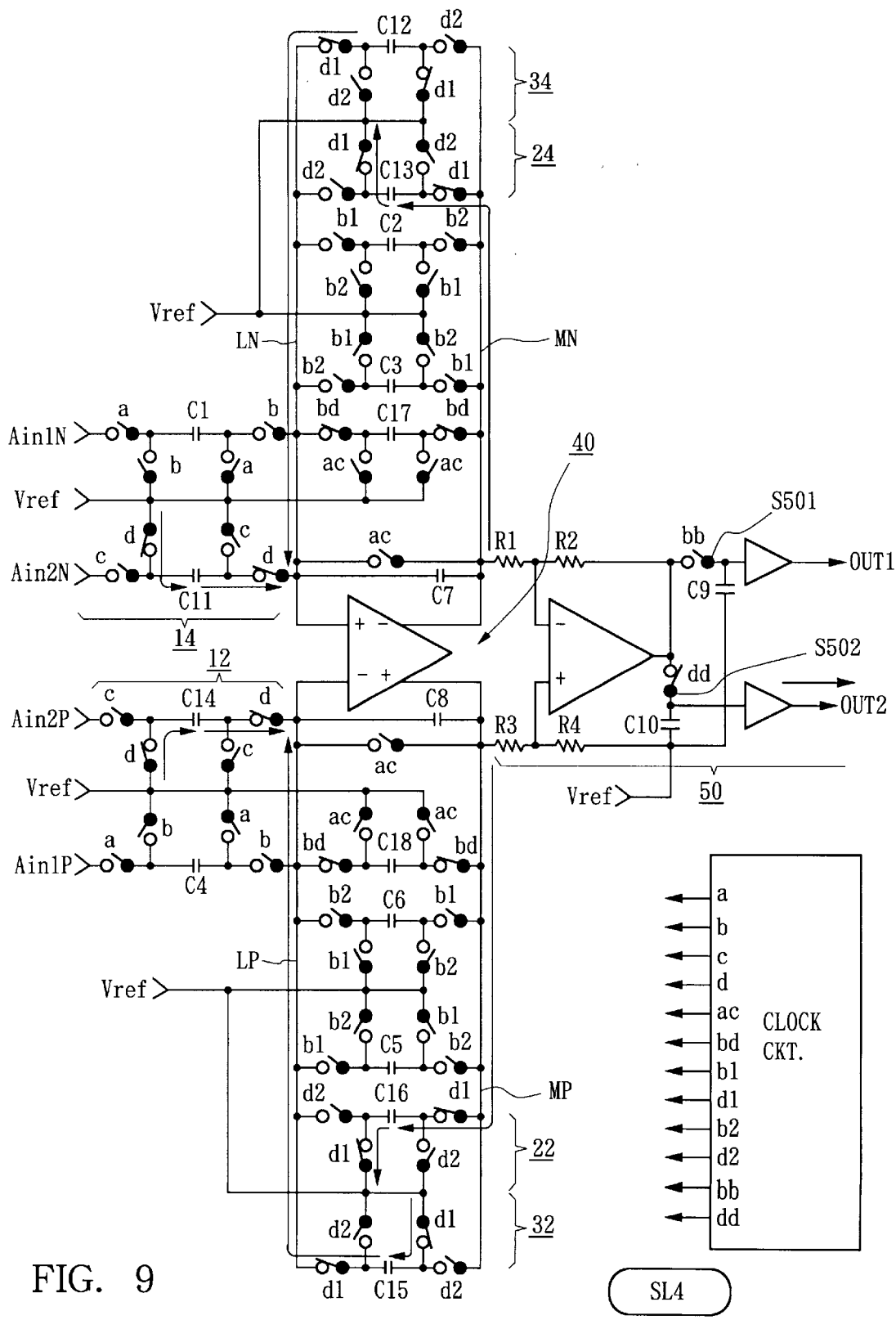
FIG. 9 is a circuit diagram showing an operation of the embodiment.

In this time slot SL4, the clocks d, bd, d1 and dd only are produced and the other clocks are not produced. By outputting of these clocks, the state of the analog switches become one shown in FIG. 9 and the following operation is performed.

(1) In the input switched capacitor sections 12 and 14, the electric charges held in the capacitors C14 and the C11 are inverted in polarity and supplied to the positive-phase input line LP and the negative-phase input line LN.

(2) In the second integrated value storage sections 32 and 34, the electric charges held in the capacitors C15 and C12 are supplied to the positive-phase input line LP and the negative-phase input line LN. The electric charges held in these capacitors have been provided from the integration section 40 in the sampling period $TS_{i-1}$ and correspond to the integrated value of the integration processing for the second channel.

(3) In the integration section 40, the initializing analog switches are opened and all of the integrating capacitors C8, C18, C7 and C18 are connected to the differential amplifier 41 so that integration of the signals of the above described operations (1) and (2) supplied through the positive-phase input line LP and the negative-phase input line LN is performed. As a result, a sum of the integrated value of the integration processing for the second channel in the sampling period $TS_{i-1}$ and the input analog signal of the second channel loaded in the time slot SL3 is provided as the integrated value for the second channel and a voltage corresponding to this integrated value is provided from the differential amaplifier 41 to the positive-phase output line MP and the negative-phase output line MN.

(4) In the first integrated value storage sections 22 and 24, an operation for holding the voltage corresponding to the integrated value of the integration processing for the second channel provided in the above described manner is performed. Since the signal path from the positive-phase output line MP to the reference power source Vref through the capacitor C16 is formed, an electric charge corresponding to the positive-phase component of the integrated value is held in the capacitor C16. Also, since the signal path from the negative-phase output line MN to the reference power source Vref through the capacitor C13 is formed, an electric charge corresponding to the negative-phase component of the integrated value is held in the capacitor 13.

(5) In the output section 50, a balanced signal representing the integrated value for the second channel provided between the positive-phase ouptut line MP and the negative-phase output line MN is converted to a non-balanced signal. This non-balanced signal is supplied to the capacitor C10 by outputting of the clock dd and also is provided as the signal OUT2. This non-balanced signal is also held in the capacitor C10 by falling of the clock dd.

5. Time Slot SL5

Figure 10:
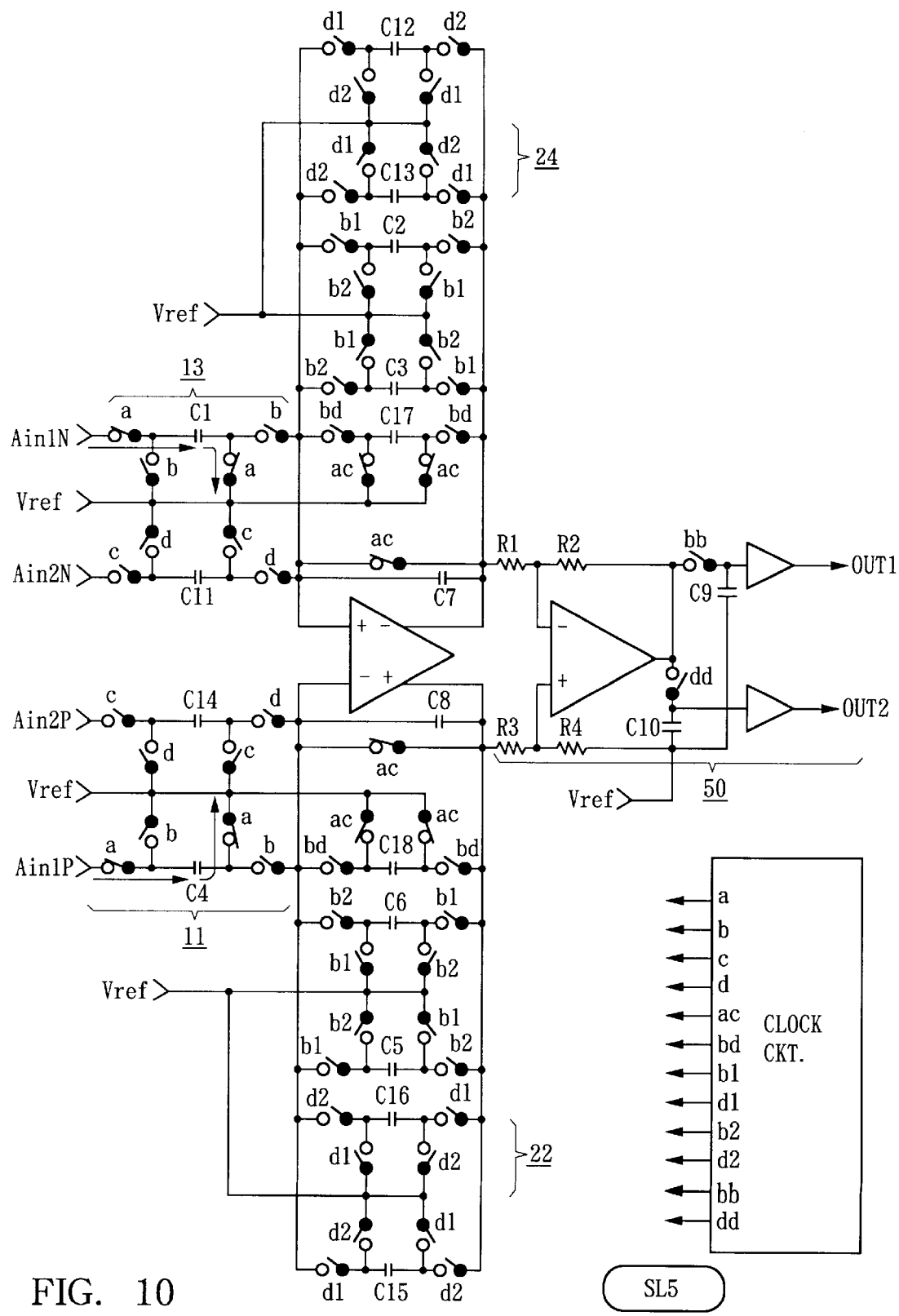
FIG. 10 is a circuit diagram showing an operation of the embodiment.

In this time slot SL5 of the sampling period $Ts_{i+1}$, the clocks a and ac only are produced and the other clocks are not produced in the same manner as in the time slot SL1. By outputting of these clocks, the state of the analog switches become one shown in FIG. 10 and the following operation is performed.

(1) In the input switched capacitor sections 11 and 13, sampling of the input analog signals Ain1P and Ain1N is performed and electric charges corresponding to the levels of the respective analog signals are held in the capacitors C4 and C1.

(2) In the integration section 40, the integrated value is reset to 0.

6. Time Slot SL6

Figure 11:
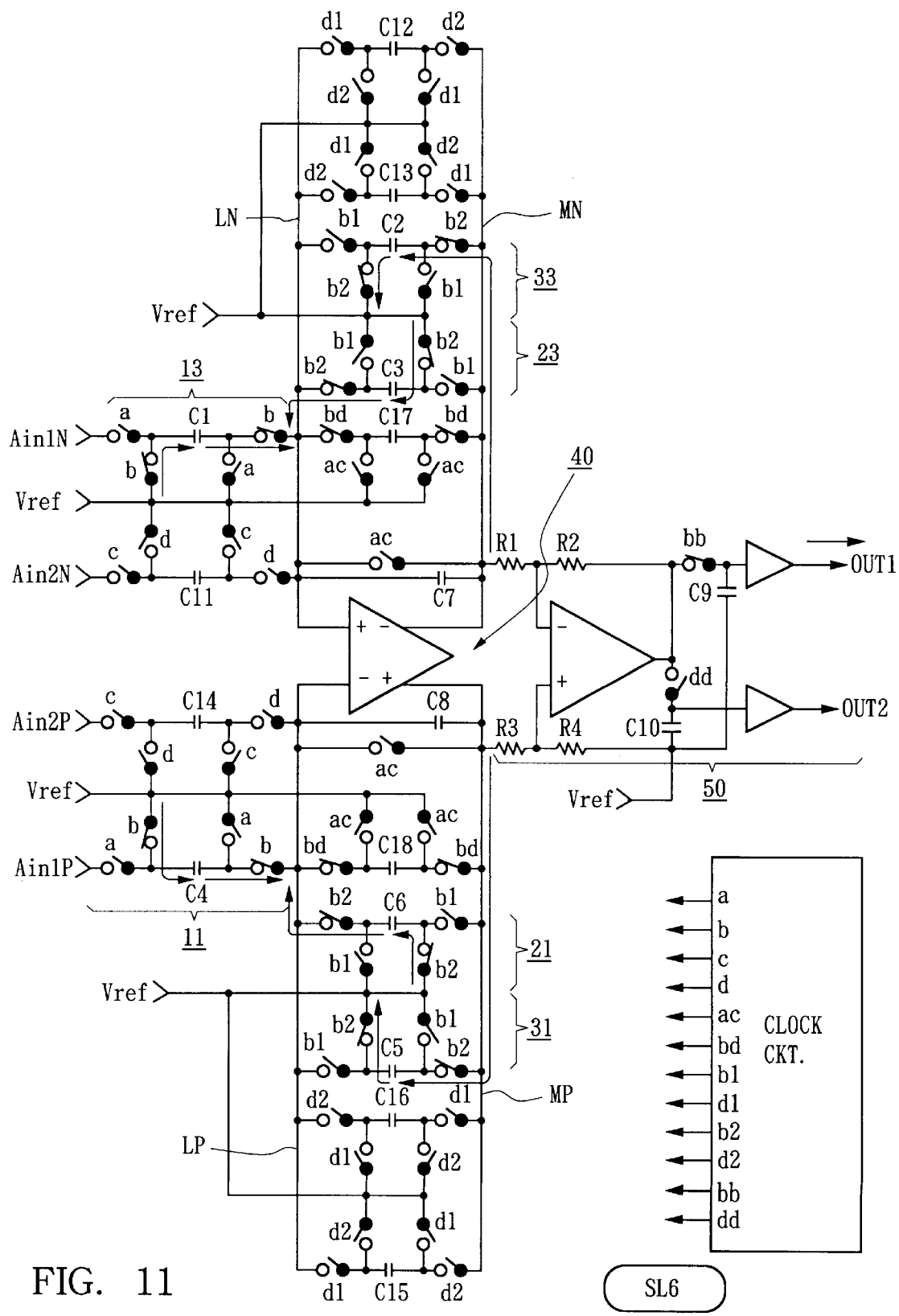
FIG. 11 is a circuit diagram showing an operation of the embodiment.

In this time slot SL6, the clocks b, bd b2 and bb only are produced and the other clocks are not produced. By output-ting of these clocks, the state of the analog switches become one shown in FIG. 11 and the following operation is performed.

(1) In the input switched capacitor sections 11 and 13, the electric charge held in the capacitors C4 and C1 are inverted in polarity and supplied to the positive-phase input line LP and the nagative-phase input line LN.

(2) In the first integrated value storage sections 21 and 23, the electric charges held in the capacitors C6 and C3 are supplied to the positive-phase input line LP and the negative-phase input line LN. The electric charges held in these capacitors are the integrated value for the first channel provided by the integration section 40 in the sampling period $TS_i$.

(3) In the integration section 40, integration of the signals of the above described processings (1) and (2) supplied through the positive-phase input line LP and the negative-phase input line LN is performed. As a result, a sum of the integrated value of the integration processing for the first channel in the sampling period $TS_i$ and the input analog signal of the first channel loaded in the time slot SL5 is provided as the integrated value for the first channel in the sampling period $TS_{i+1}$ and a voltage corresponding to this integrated value is supplied from the differential amplifier 41 to the positive-phase output line MP and the negative-phase output line MN.

(4) In the second integrated value storage sections 31 and 33, voltage corresponding to the integrated value of the integration processing for the first channel obtained in the above described manner is held in the capacitors C5 and C2.

(5) In the ouptut section 50, the balanced signal representing the integrated value of the first channel provided between the positive-phase output line MP and the negative-phase output line MN is converted to a non-balanced signal and is provided as the signal OUT1.

As described above, contents of the processing in the time slot SL6 is substantially the same as the contents of the processing in the time slot SL2 in the sampling period $TS_i$ and are different only in that the functions of the first integrated value storage sections 21 and 23 and those of the second integrated value storage sections 31 and 33 are replaced by each other.

7. Time Slot SL7

Figure 12:
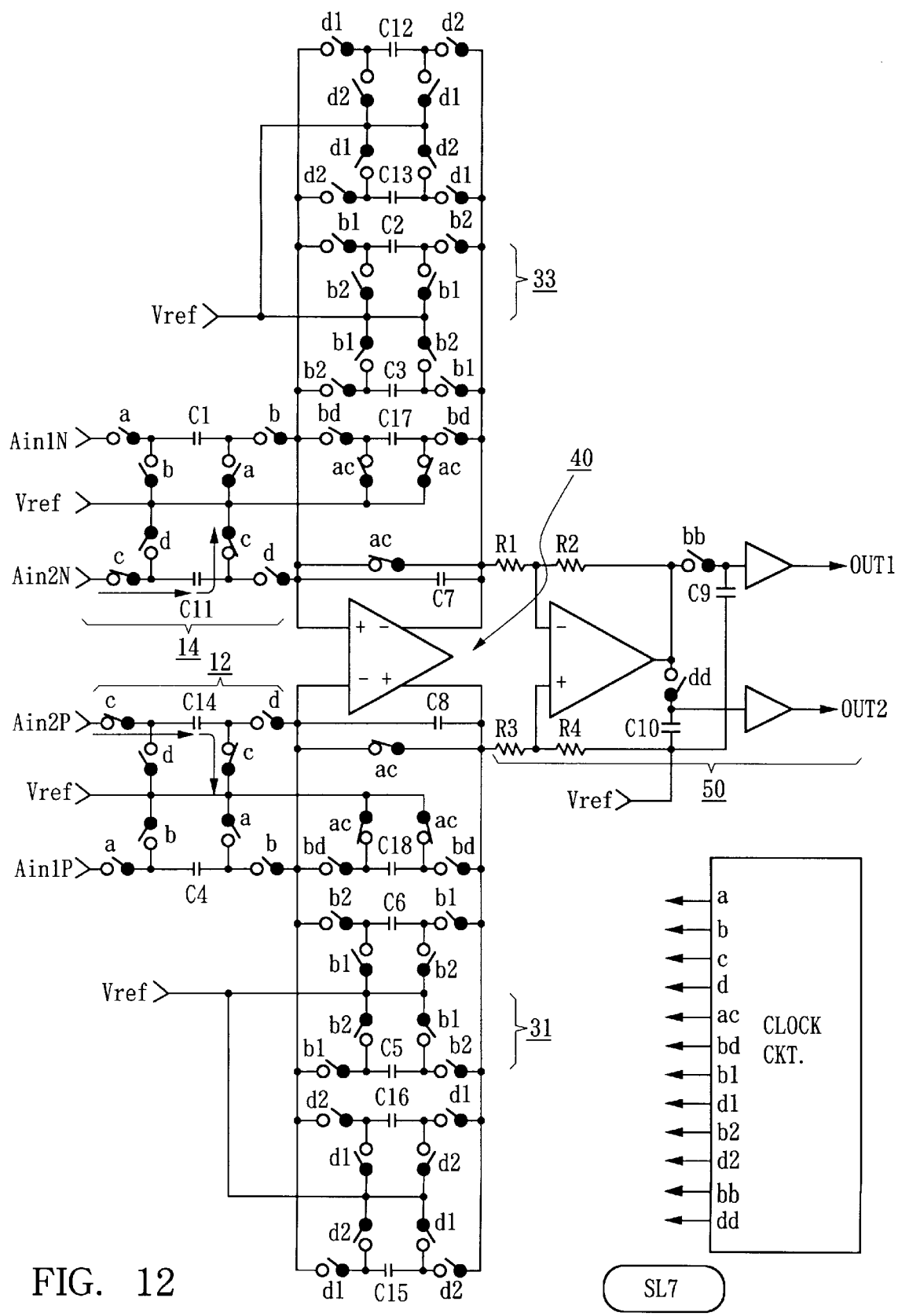
FIG. 12 is a circuit diagram showing an operation of the embodiment.

In this time slot SL7, the clocks c and ac only are produced and the other clocks are not produced. By outputting of these clocks, the state of the analog switches become one shown in FIG. 12 and the following operation is performed.

(1) In input switched capacitor sections 12 and 14, sampling of the input analog signals Ain2P and Ain2N is again performed and electric charges corresponding to the levels of the respective analog signals are held in the capacitors C14 and C11.

(2) In the integration section 40, the integrated value is reset to 0.

8. Time Slot SL8

Figure 13:
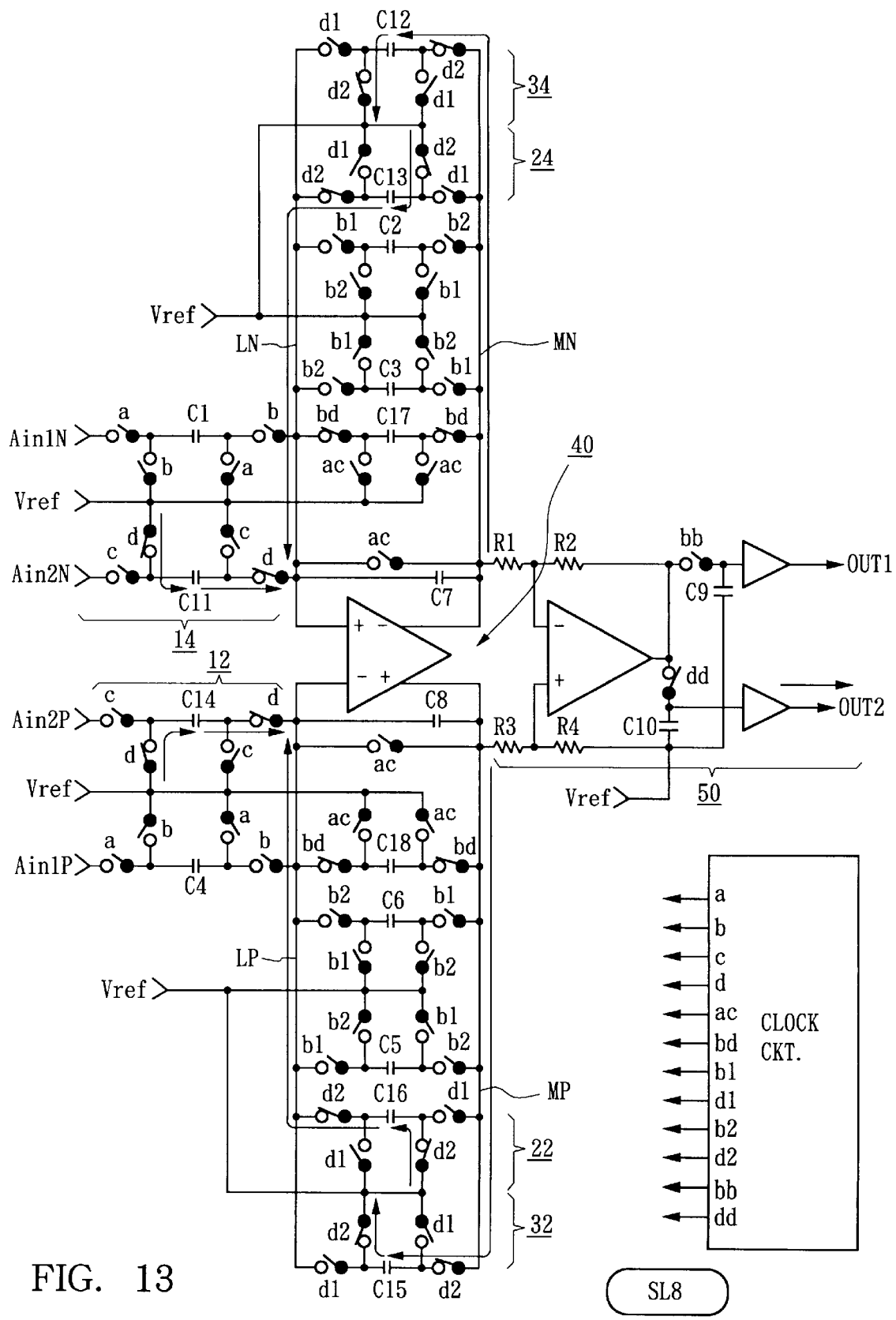
FIG. 13 is a circuit diagram showing an operation of the embodiment.

In this time slot SL8, the clocks d, bd, d2 and dd only are produced and the other clocks are not produced. By outputting of these clocks, the state of the analog switches become one shown in FIG. 13 and the following operation is performed.

(1) In the input switched capacitor sections 12 and 14, the electric charges held in the capacitors C14 and C11 are inverted in polarity and supplied to the positive-phase input line LP and the negative-phase input line LN.

(2) In the first integrated value storage sections 22 and 24, the electric charges held in the capacitors C16 and C13 are supplied to the positive-phase input line LP and the negative-phase input line LN. These electric charges are the integrated value for the second channel provided from the integration section 40 in the sampling period $TS_i$.

(3) In the integration section 40, integration of the signals of the above described processings (1) and (2) supplied through the positive-phase input line LP and the negative-phase input line LN is performed. As a result, a sum of the integrated value of the integration processing for the second channel in the sampling period $TS_i$ and the input analog signal of the second channel loaded in the time slot SL7 is provided as the integrated value for the second channel in the present aspling period $TS_{i+1}$ and voltage corresponding to this integrated value is supplied from the differential amplifier 41 to the positive-phase output line MP and the negative-phase output line MN.

(4) In the second integrated value storage sections 32 and 34, voltage corresponding to the integrated value for the second channel obtained in the above described manner is held in the capacitors C15 and c12.

(5) In the output section 50, the balanced signal representing the integrated value for the second channel provided between the positive-phase ouptut line MP and the negative-phase output line MN is converted to a non-balanced signal and is provided as the signal OUT2.

As described above, the contents of the processing in the time slot SL8 are substantially the same as the contents of the processing in the time slot SL4 and are different only in that the functions of the first integrated value storage sections 22 and 24 and those of the second integrated value storage sections 32 and 34 are replaced by each other.

The processings at the time slots SL1 to SL8 are thereafter performed repeatedly and the integration procesings for the first and second channels are thereby performed. The filter processing for the respective channels is implemented by employing the results of these integration processings.

Various modifications of the above described embodiment can be conceived. Some of these modifications will be described below.

(1) In the above described embodiment, the analog signal is a balanced signal and the integration of the analog signal is performed by the integration section composed of a differential amplifier. Alternatively, an analog signal in the form of a non-balanced signal may be integrated by an ordinary integrator which is not of a differential type.

(2) A single integrated value storage section may be provided for each integration processing, an integration processing by an integration section may be performed by using an electric charge held in this integrated value storage section and thereafter an electric charge corresponding to a new integrated value may be held in the integrated value storage section. This arrangement requires a time slot for holding an electric charge corresponding to an integrated in addition to the time slot for performing the integration processing but still has the advantage that the number of the integrated value storage sections is reduced to half of the above described embodiment.

(3) In a case where it is necessary to implement a larger number of integration processings than the above described embodiment, integrated value storage sections corresponding to the number of the integration processings may be provided.

What is claimed is:

1. A switched capacitor circuit for filtering input analog signals of plural channels on a time multiplexed basis comprising:

a plurality of input switched capacitor sections for receiving receptive ones of said input analog signals;

an integration circuit having an input coupled to said plurality of input switched capacitor sections and an output for sequentially implementing integration processing on each of said input analog signals of the plural channels on said time multiplexed basis to provide an integration result for each of the plural channels;

a plurality of switched capacitor storage circuits coupled to the input and the output of said integration circuit, each switched capacitor storage circuit storing an integrated value representing the integration result for an associated one of the plural channels; and a plurality of switches coupled to said input and said output for:

causing, each time the integration processing for a particular one of the plural channels is completed, storage of said integrated value representing the integration result for the particular channel in a switched capacitor storage circuit associated with the particular channel; and initialization of the integration circuit for a subsequent one of the plural channels by coupling a switched capacitor storage circuit associated with the subsequent channel with the integration circuit; and said each time the integration processing for the particular channel is commenced, supplying to the integration circuit the integrated value for the particular channel from the switched capacitor storage circuit associated with the particular channel; and a respective input analog signal corresponding to the particular channel.

2. A switched capacitor circuit as defined in claim 1 wherein each of said switched capacitor storage circuits includes at least two storage sections, when the integration processing for the particular channel is commenced, initialization of the integration result in the integration circuit with the integrated value for the particular channel stored in a first storage section of the switched capacitor storage circuit associated with the particular channel; and when the integration processing for the particular channel completes, storage of the integration result in a second storage section of the switched capacitor storage circuit associated with the particular channel.

3. A switched capacitor circuit as defined in claim 1, wherein said integration circuit sequentially integrates the input analog signals of the plural channels on the time multiplexed basis.

4. A method for filtering input analog signals of plural channels on a time multiplexed basis, the method comprising:

integrating the input analog signals of respective ones of the plural channels received at input switched capacitor sections on the time multiplexed basis to provide an integration result for each of the plural channels;

storing an integrated value representing the integration result for each of the plural channels in an associated one of a plurality of switched capacitor storage circuits, each of the switched capacitor storage circuits being associated with one of the plural channels;

each time the integration processing for a particular one of the plural channels completes, storing said integrated value representing the integration result for the particular channel in said switched capacitor storage circuit associated with the particular channel to initialize the integration result of said subsequent step for integrating the input analog signal of the particular channel; and each time the step for integrating an input analog signal of the particular channel is commenced, supplying the integrated value for the particular channel from the associated switched capacitor storage circuit and the input analog signal of the particular channel as inputs to the step for integrating.

5. The method of claim 4 wherein the switched capacitor storage circuit associated with the particular channel includes at least a first storage section and a second storage section, the method further comprising:

each time the step for integrating the input analog signal of the particular channel is commenced, initializing the integration result with the integrated value for the particular channel stored in the first storage section;

supplying the input analog signal for the particular channel as an input to the step for integrating the input analog signal; and storing the integration result for the particular channel in the second storage section.

6. The method of claim 4, the method further comprising sequentially integrating the analog input signals of the plural channels on said time multiplexed basis.

* * * * *